United States Patent [19]

Hodes et al.

[11] 4,296,188

[45] Oct. 20, 1981

[54] CD(SE,TE) ALLOY PHOTOVOLTAIC MATERIALS

[75] Inventors: Gary Hodes; David Cahen; Joost Manassen, all of Rehovot, Israel

[73] Assignee: Yeda Research and Development Company Ltd., Rehovot, Israel

[21] Appl. No.: 134,665

[22] Filed: Mar. 27, 1980

[30] Foreign Application Priority Data

Jul. 7, 1979 [IL] Israel ..................................... 57908

[51] Int. Cl.$^3$ ............................................. H01M 6/36
[52] U.S. Cl. ................................. 429/111; 136/260
[58] Field of Search ................. 429/111; 136/89 CD, 136/89 ST, 260, 264; 357/30, 61; 252/62.3 S, 62.3 ZT

[56] References Cited

U.S. PATENT DOCUMENTS

| | | | |
|---|---|---|---|
| 3,496,024 | 2/1970 | Ruehrwein | 136/89 |
| 4,064,326 | 12/1977 | Manassen et al. | 429/111 |
| 4,084,044 | 4/1978 | Heller et al. | 429/111 |
| 4,127,449 | 11/1978 | Heller | 204/2.1 |
| 4,172,925 | 10/1979 | Chen | 429/111 |
| 4,204,933 | 5/1980 | Barlow et al. | 204/181 N |

FOREIGN PATENT DOCUMENTS

| | | | |
|---|---|---|---|
| 2844712 | 4/1979 | Fed. Rep. of Germany | 136/89 CD |
| 1532616 | 11/1978 | United Kingdom | 136/89 CD |

OTHER PUBLICATIONS

R. N. Noufi et al., "Semiconductor Electrodes XV. Photoelectrochemical Cells With Mixed Polycrystalline n-Type CdS–CdSe Electrodes," *J. Electrochem. Soc.*, vol. 125 (1978), pp. 375–379.

A. J. Strauss et al., "Phase Diagram of the CdTe–CdSe Pseudo-Binary System," *J. Electrochem. Soc.*, vol. 117, (1970), pp. 1420–1426.

H. Tai et al., "Optical Properties of $(CdTe)_{1-x}(CdSe)_x$ and $(CdTe)_{1-x}(CdS)_x$ Systems," *Phys. Stat. Sol.* (a), vol. 30, K115–K119 (1975).

Berishvili et al., *Poloprovodn Tekh Mikroelecktron*, vol. 28, pp. 23–31 (1978).

A. D. Stuckes, "Electrical & Thermal Properties of Alloys of CdTe and CdSe," *J. Phys. Chem. Solids*, vol. 25, pp. 477–482 (1964).

*Chem. Abstracts*, vol. 77, 157719d (1972).

*Chem. Abstracts*, vol. 87 110018r (1977).

*Primary Examiner*—Aaron Weisstuch
*Attorney, Agent, or Firm*—Sandler and Greenblum

[57] ABSTRACT

A photovoltaic system comprising a Cd(Se,Te) alloy junction forming material.

A process of preparing a thin layer of the alloy by electrodeposition and by application of a slurry of the alloy to a substrate which is then annealed at an elevated temperature.

The junction forming material finds particular application in photoelectrochemical cell systems; particularly those containing S/S=electrolytes. Electrodes formed of the inventive materials exhibit increased efficiency and improved stability.

8 Claims, No Drawings

CD(SE,TE) ALLOY PHOTOVOLTAIC MATERIALS

BACKGROUND OF THE INVENTION

1. Field of the Invention

The invention relates to a photovoltaic system wherein a Cd(Se,Te) alloy is used in the junction forming material.

2. Description of Prior Art

U.S. Pat. No. 4,064,326 discloses a device for direct conversion of radiant energy into electrical energy by means of a photoelectrochemical cell (PEC).

The photoelectrode is in many respects the most important part of the PEC as it determines the maximum possible energy conversion efficiency of the device. U.S. Pat. No. 4,064,326 discloses a series of materials that may be used as photoelectrodes and redox couples which enable the stable use of such photoelectrodes. A major problem in such PEC's is the necessity of using deeply colored, highly oxygen sensitive, poisonous Se/Se$^=$ and/or Te/Te$^=$ redox couples with a CdTe photoelectrode, which has a 1.45 eV optical bandgap, eminently suited for photovoltaic solar energy conversion (0.3 eV lower than CdSe, which may be used in stable S/S$^=$ PEC's). No attempts have been made until this time to use mixed Cd(Se,Te) materials as photoelectrodes or, for that matter, as photovoltaic materials in general.

The electrical and thermal properties, specifically the electrical conductivity, Hall constant, thermoelectric power and thermal conductivity of alloys of CdTe and CdSe have been investigated by Stuckes and Farrell (J. Phys. Chem. Sol. 25, 477, (1964)). Gorodetskii et al studied the photoconductivity of such alloys (Chem. Abstr. 77; 157719d); Gavrilenko et al reported on the temperature dependence of space charge limited currents in diode structures containing CdTe$_{0.7}$Se$_{0.3}$ (Chem. Abstr. 87; 110018). Berishvili et al studied the voltage-current characteristics of Cd(Se,Te) alloys with In contacts, with emphasis on their photoconductive properties (Poluprovodn. Tckh. Mikroelektron., 28, 23 (1978)). Strauss and Steininger (J. Electrochem. Soc. 117, 1420 (1970)) have described the equilibrium phase diagram of (CeTe)$_{1-x}$(CdSe)$_x$ and defined the equilibrium conditions for formation of hexagonal (wurtzite) and cubic (zincblende) structure. Tai, Nakashima and Hori (Phys. Stat. Sol. (a) 30, K115 (1975)) describe the optical properties of the Cd(Se,Te) alloys and find an optical bandgap minimum of ~1.40 eV for compositions containing between 30 and 50% CdSe in the cubic structure and of ~1.45 eV for compositions containing between 40 and 65% CdSe in the hexagonal structure. No uses of the CdSe/CdTe alloys in photovoltaic devices have been described.

SUMMARY OF THE INVENTION

It is, therefore, an object of the invention to provide a photovoltaic system which may take advantage of the properties offered by a Cd(Se,Te) alloy.

It is a further object of the invention to provide a photoelectrochemical system in which S/S$^=$ redox couples may be used thereby avoiding the use of deeply colored, highly oxygen sensitive, poisonous Se/Se$^=$ and/or Te/Te$^=$ redox couples normally used with CdTe photoelectrodes.

These and other objects are fulfilled by means of the photovoltaic system and processes of the invention.

According to the invention, a photovoltaic system is provided which comprises a Cd(Se,Te) alloy.

In a preferred embodiment of the invention, the photovoltaic system is a photoelectrochemical cell and the cell comprises a semi-conductor photoelectrode comprising a Cd(Se,Te) alloy.

The semi-conductor photoelectrode preferably comprises a semi-conductor layer comprising at least about 90 mole-% Cd(Se,Te). According to the invention it is further possible to provide a layer which consists essentially of or even entirely of Cd(Se,Te) alloy.

The layer may additionally comprise up to about 10% by weight of a chalcogenide selected from the group of zinc, mercury or mixtures thereof. Furthermore, the layer may also comprise up to about 10% by weight of a cadmium chalcogenide selected from the group comprising sulfur or oxygen.

The system may comprise from about 30 mole-% to about 90 mole-% CdSe and the alloy may further comprise from about 10 mole-% to about 70 mole-% CdTe. In a most preferred embodiment of the invention the alloy comprises between about 40 mole-% to about 75 mole-% CdSe.

By virtue of the unique structure of the electrode, a preferred embodiment of the invention makes it possible to use an S/S$^=$ redox couple electrolyte in conjunction with the system.

The preferred structure of the alloy is a hexagonal wurtzite-like structure.

According to a preferred process of the invention for preparing a photoelectrode, CdSe and CdTe are electro-deposited onto an electrically conductive substrate and the deposited CdSe and CdTe is subsequently heated.

The heat treatment is preferably performed under conditions sufficient to anneal the deposited material.

In an alternative preferred embodiment, the photoelectrode may be prepared by the steps of preparing a Cd(Se,Te) slurry and then applying the slurry to an electrically conductive substrate. The substrate coated with the slurry is then annealed at an elevated temperature. The slurry itself may be made by preparing a powder formed by mixing granular CdSe and CdTe and then grinding the mixture. The ground mixture is then fired and then cooled. Finally, the cooled mixture is ground.

DESCRIPTION OF PREFERRED EMBODIMENTS

The invention relates to a photovoltaic system wherein a Cd(Se,Te) alloy is used in the junction forming material. A preferred embodiment is a semiconductor photoelectrode for a photoelectrochemical cell, whose semiconductor portion comprises a Cd(Se,Te) alloy. Preferably, at least 90 mole-% of this layer is in the form of the Cd(Se,Te) alloy. The invention furthermore relates to a process for the production of such photovoltaic systems, and to such photovoltaic systems.

Photoelectrochemical cells containing semiconductor photoelectrodes according to the invention advantageously comprise polychalcogenide (S,Se,Te)-containing electrolytes. The photoelectrodes described here provide for an improved utilization of the solar spectrum for direct conversion of solar energy to electrical energy by an improved match of the semiconductor light absorption characteristics to the solar spectrum. Because of the nature of this conversion process there exists an optimal bandgap region, which depends somewhat on the air-mass through which the solar energy reaches the device, and this optimum lies around 1.4 eV. CdTe, which has an optical bandgap in this optimum region, cannot be used in a PEC unless highly colored, very oxygen sensitive and poisonous Te/Te= or Se/Se= redox couples are added to the electrolyte to form a stable system. In S/S=—containing electrolytes the semi-conductor rapidly deactivates, i.e., is unstable. On the other hand CdSe—based PEC's are stable in the less colored, less poisonous, less oxygen sensitive and cheaper S/S=—containing electrolytes, but CdSe has a 1.7 eV bandgap, resulting in less than optimal use of solar energy.

Surprisingly, the use of Cd(Se,Te) alloys, especially those containing between 30 and 90 mole-% CdSe, and preferably between 40 and 75 mole-% CdSe in photovoltaic devices, especially PEC's have proven very advantageous. Such alloys have bandgaps lower than CdSe, and at certain compositions even lower than CdTe. These alloys can be used in S/S= containing electrolytes and such systems are surprisingly stable, in contrast to pure CdTe-based PEC's in this electrolyte, over a wide composition range. PEC's based on Cd(Se,Te) alloys have a performance superior to those based on pure CdSe as they give higher photocurrents, because of their lower bandgap, without seriously affecting their photovoltage. This is illustrated in Table I.

TABLE I

Performance of polycrystalline thin film photoelectrodes in PEC's.

| Photoelectrode | Electrolyte | (1) Voc | (2) Isc | (3) η (%) | (4) light intensity (xAM1) |
|---|---|---|---|---|---|
| CdSe | $S_n^{2-}$ | 630 | 11.0 | 3.5 | 1.0 |
| CdTe(p-type) | $Te_n^{2-}$ | 30 | 0.7 | 0.01 | 0.9 |
| $CdSe_{0.74}Te_{0.26}$ | $S_n^{2-}$ | 645 | 11.0 | 4.1 | 0.84 |
| $CdSe_{0.65}Te_{0.35}$ | $S_n^{2-}$ | 625 | 14.2 | 5.1 | 0.85 |
| $CdSe_{0.5}Te_{0.5}$ | $S_n^{2-}$ | 642 | 13.3 | 5.0 | 0.79 |
| $CdSe_{0.25}Te_{0.75}$ | $S_n^{2-}$ | 407 | 15.0 | 3.5 | 0.82 |
| CdTe(n-type) | $S_n^{2-}$ | 570 | 10.2 | 3.3 | 0.83 |
| $CdSe_{0.65}Te_{0.25}S_{0.1}$ | $S_n^{2-}$ | 585 | 10.2 | 3.3 | 0.85 |

(1) Open-circuit voltage in mV
(2) Short-circuit current in $mA/cm^2$
(3) Solar energy conversion efficiency, in %
(4) Illumination intensity (xAM1)

The active part of the photoelectrode may be in the form of a single crystal, pressed pellet or thin film, epitaxially grown or polycrystalline Cd(Se,Te) on a suitable electrically conducting substrate such as Ti,Cr-plated steel, graphite, electrically conducting transparent glass etc.

A thin Cd(Se,Te) film may be prepared by vapor deposition techniques such as spray pyrolysis, vacuum evaporation, sputtering and the like. It may be formed electrochemically by electro-deposition of CdSe and CdTe and subsequent heat treatment for annealing or by painting a thin layer of slurry onto the conducting substrate. This slurry contains the parent materials in the desired proportions, mixed with suitable liquid carrier which efficiently wets the solid particles, so that the resulting slurry has a suitable viscosity for application to the substrate. The solid particles may be prepared by high temperature reaction of the elements, electrochemically or by any other suitable method as is clear to those skilled in the art.

EXAMPLE 1

A powder of nominal composition $CdSe_{0.65}Te_{0.35}$ is prepared as follows:

99.999% CdSe (3μ grain size) and CdTe (99.99% ~10μ grain size) are mixed in 13:7 molar ratio with 25% w/w $CdCl_2.2.5H_2O$. This mixture is ground with 2 drops of ethanol per 100 mg mixture and is allowed to dry at room temperature. The dried powder is fired at 660° C. for 40 min. in an atmosphere containing 10 ppm $O_2$ in Ar, and cooled subsequently in the same atmosphere. This material is used as the starting powder, after light grinding, to prepare a 0.22 $cm^2$ photoelectrode by painting on a titanium substrate preoxidized by being preheated for 40 secs in an atmosphere of 20 ppm $O_2$, in Ar, at 650° C. The paint comprises a mixture of the alloy and $CdCl_2.2.5H_2O$ acting as a fluxing agent in a ratio of 50:3 w/w, ground together with a mixture of 5% (v/v) nonionic detergent in water to give a smooth slurry. For each 50 mg of powder, 0.05 ml of the detergent in water is used. The covered substrate is dried at room temperature and heated under the same conditions as used for the Ti substrate, but for 12 mins. It then is cooled slowly (over a 5 minute period) to room temperature in the same atmosphere. The thus annealed, cooled substrate is used in a PEC, further comprising a sulfided brass gauze counterelectrode (Israeli Patent Application No. 56621) and an aqueous 1 molar solution each in KOH, $Na_2S.9H_2O$ and S. Under 0.85 AM1 illumination, and after etching for 5 seconds in 3% $HNO_3$ in conc. HCl (v/v) followed by dipping in 0.1 M $K_2CrO_4$ in water this PEC gave a 3.15 mA short-circuit current, 440 mV at 2.19 mA over optimal load, 625 mV open-circuit potential (5.1% conversion efficiency). Under ~3×AM1 conditions, this PEC showed no deactivation after 50 hrs of continuous operation at short circuit current. The semi-conductor layer had a hexagonal (wurtzite-like) structure, as verified by X-ray diffraction.

EXAMPLE 2

An electrode was prepared as in Example 1, using a 65:35 molar ratio mixture of CdSe and CdTe, on Cr-plated steel as a substrate (prepared by plating mechanically cleaned steel in a solution of 3 M $CrO_3$ and 0.026 M $H_2SO_4$ in $H_2O$, using a Pt anode and a current density of 200 $mA/cm^2$, for 10 mins, at room temperature; subsequently heated as the Ti substrate in example 1, but for 3 minutes). The resulting 1 $cm^2$ electrode, when used in a PEC as in example 1, gave a short circuit current of 8.5 mA, an open circuit voltage of 570 mV and 385 mV over 70 Ω optimal photopotential, yielding 2.1 mW under 0.82 AM1 simulated conditions (~2.6% conversion efficiency). Under 3.5×AM1 conditions this electrode was stable for a period corresponding to more than one month under AM1 illumination.

EXAMPLE 3

A piece of titanium metal, 3×1 cm, was preoxidized as in Example 1. An area of 1×1 cm of this Ti was immersed in a 2 N aqueous solution of $H_2SO_4$ containing 0.5 M $CdSO_4$ and saturated with $TeO_2$ at room temperature with stirring. When the Ti was connected through an ammeter to a Cd rod immersed in the same solution, a current of 4 mA was registered. Small quantities of $SeO_2$ were added (on the order of millimolar concentrations) until the current reached 16 mA. Electrolysis was continued for 10 minutes. The resulting electrode of composition $CdSe_{0.75}Te_{0.25}$ (calculated from the relative current contributions of the $TeO_2$, and $SeO_2$) was annealed under the same conditions as for Example 1, but at 625° C. The electrode was etched for 10 sec. in a 50—50 (v/v) solution of HCl in water, and then blanked off by a lacquer of tar in toluene to 0.65 $cm_2$. Under simulated AM1 conditions, this electrode gave in 1 M each of KOH, $Na_2S.9H_2O$ and S, a short circuit current of 7.5 mA, an open circuit voltage of 530 mV and a fill factor of 39% yielding a conversion efficiency of 2.4%.

Although the invention has been described with respect to particular voltaic systems, counterelectrodes, electrolytes and the like, it is to be understood that the invention extends beyond those the particular voltaic systems, materials and processes specifically disclosed to cover all inventions falling within the scope of the claims.

What is claimed is:

1. A photoelectrochemical cell comprising a photoelectrode, an electrolyte comprising a $S/S^=$ redox couple, and a counterelectrode, said photoelectrode comprising a Cd(Se,Te) alloy, and wherein said alloy comprises between 40 mole-% to about 75 mole-% CdSe.

2. A photoelectrochemical cell comprising a photoelectrode, an electrolyte, and a counterelectrode, said photoelectrode comprising a Cd(Se,Te) alloy comprising about 30 mole % to about 90% mole % CdSe and wherein said electrolyte comprises a $S/S^=$ redox couple.

3. The photoelectrochemical cell as defined by claim 16 wherein said photoelectrode comprises a semiconductor layer, said layer comprising at least about 90 mole-% of said Cd(Se,Te) alloy.

4. The photoelectrochemical cell as defined by claim 3 wherein said layer consists essentially of said Cd(Se,Te) alloy.

5. A photoelectrochemical cell as defined by claim 3 wherein said layer additionally comprises up to about 10% by weight of a chalcogenide of a member selected from the group comprising cadmium, zinc, mercury or mixtures thereof.

6. The photoelectrochemical cell as defined by claim 2 wherein said alloy comprises about 40 mole-% to about 75 mole-% CdSe.

7. The photoelectrochemical cell as defined by claim 2 wherein said alloy comprises between about 10 mole-% to about 70 mole-% CdTe.

8. The photoelectrochemical cell as defined by either of claims 2 or 1 wherein said alloy has hexagonal wurtzite-like structure.

* * * * *

UNITED STATES PATENT AND TRADEMARK OFFICE
CERTIFICATE OF CORRECTION

PATENT NO. : 4,296,188
DATED : October 20, 1981
INVENTOR(S) : Gary HODES et al.

It is certified that error appears in the above—identified patent and that said Letters Patent is hereby corrected as shown below:

Column 6, line 6 (claim 3), "16" should be --2--.

Signed and Sealed this

Twenty-ninth Day of March 1983

[SEAL]

Attest:

GERALD J. MOSSINGHOFF

Attesting Officer　　Commissioner of Patents and Trademarks